United States Patent [19]

Yuen

[11] Patent Number: 4,736,125
[45] Date of Patent: Apr. 5, 1988

[54] UNBUFFERED TTL-TO-ECL TRANSLATOR WITH TEMPERATURE-COMPENSATED THRESHOLD VOLTAGE OBTAINED FROM A CONSTANT-CURRENT REFERENCE VOLTAGE

[75] Inventor: Raymond C. Yuen, San Diego, Calif.

[73] Assignee: Applied Micro Circuits Corporation, San Diego, Calif.

[21] Appl. No.: 901,138

[22] Filed: Aug. 28, 1986

[51] Int. Cl.⁴ ............... H03K 19/092; H03K 19/003; H03K 17/14; G05F 3/16
[52] U.S. Cl. ..................... 307/475; 323/314; 323/907; 307/455; 307/310; 307/296 R
[58] Field of Search ............ 307/475, 455, 443, 446, 307/310, 454, 296 R, 456, 551; 323/313, 314, 907

[56] References Cited

U.S. PATENT DOCUMENTS

| | | | |
|---|---|---|---|
| 3,758,791 | 9/1973 | Taniguchi et al. | 307/310 |
| 3,986,045 | 10/1976 | Lutz | 207/207 |
| 4,329,597 | 5/1982 | Yamagiwa | 307/310 |
| 4,339,822 | 7/1982 | Kolodzey | 372/26 |
| 4,368,395 | 1/1983 | Taylor | 307/456 |
| 4,533,842 | 8/1985 | Yang et al. | 307/475 |
| 4,540,900 | 9/1985 | Early et al. | 307/475 |
| 4,599,521 | 7/1986 | Kanai et al. | 307/475 |
| 4,658,205 | 4/1987 | Yamada | 307/310 |
| 4,684,831 | 8/1987 | Kruest | 307/455 |

FOREIGN PATENT DOCUMENTS 0052565 5/1982 European Pat. Off. ............ 307/456

OTHER PUBLICATIONS

"F100K ECL Data Book"–Fairchild Camera and Instrument Corporation, 1982, pp. 2-7.

Primary Examiner—Stanley D. Miller
Assistant Examiner—Tai V. Duong
Attorney, Agent, or Firm—Brown, Martin, Haller & Meador

[57] ABSTRACT

A circuit for translating TTL-to-ECL-type signals utilizes an unbuffered emitter-coupled transistor pair for shifting signal levels. The emitter-coupled transistor pair operates by switching a current from a current-source transistor, with the switching being performed against a temperature-compensated threshold voltage that is derived from a reference voltage provided to the current source transistor. Direct, unbuffered switching of the emitter-coupled transistor pair insures rapid, symmetrical response to the TTL signals that drive the transistor pair and produces high-quality, relatively undistorted ECL waveforms. Provision of a current-source reference voltage stabilized with respect to temperature also contributes to reduction of distortion in the ECL waveforms. The threshold voltage is obtained from the current source reference voltage through a current mirror circuit.

5 Claims, 2 Drawing Sheets

UNBUFFERED TTL-TO-ECL TRANSLATOR WITH TEMPERATURE-COMPENSATED THRESHOLD VOLTAGE OBTAINED FROM A CONSTANT-CURRENT REFERENCE VOLTAGE

BACKGROUND OF THE INVENTION

This invention relates to circuitry for translating TTL signals to ECL-compatible signals and, more particularly, relates to a TTL-to-ECL converter that produces ECL-compatible waveforms with a minimum of distortion over a predetermined temperature range.

Hybrid logic circuits that combine two or more conventional logic families in a single integrated circuit have been widely considered in the prior art. For example, U.S. patent application No. 642,756, filed on Aug. 21, 1984, now U.S. Pat. No. 4,684,831, issued Aug. 4, 1987 and assigned to the assignee of this patent application, describes a family of hybrid logic circuitry which mixes high-speed linear logic, such as ECL, with digital circuitry, such as TTL, to provide the ability to custom design logic systems. As stated in the referenced patent application, the reason for combining logic families in a single monolithic IC is to wed the operational speed of the emitter-coupled logic with the noise tolerance and relatively low power consumption of saturated logic such as TTL.

One example of the integration of the two logic families into a single logic array is the Q700 logic array family available from Applied Micro Circuits Corporation, San Diego, Calif., the assignee of this patent application.

As is known, the interface between different logic families in a hybrid logic IC requires translation of, for example, TTL logic signal levels to the signal levels of a linear logic family such as ECL. This requirement is well-known and can be understood with reference, for example, to the background section of Yang et al. U.S. Pat. No. 4,533,842. As stated in the Yang patent, a primary design goal for such a converter is to perform the signal level conversion over the military temperature range ($-55°$ C. to $125°$ C.).

The Yang patent presents a design for stabilizing the operation of a TTL-to-ECL converter over the specified military temperature range. However, a major drawback of the class of prior art TTL-to-ECL converters represented by the Yang patent is that the temperature sensitivity they are designed to avoid resides in a buffer portion interfacing the TTL and ECL portions of the converter. What has not yet been realized regarding such prior art converters is that the buffer, whether temperature-compensated or not, itself imposes a significant degradation in the operation of the converter. This damaging effect can be understood with reference to FIG. 1.

In the prior art converter of FIG. 1, a pair of emitter-coupled transistors $Q_1$ and $Q_2$ are connected to an emitter current source transistor $Q_3$. The level of current switched between the transistors $Q_1$ and $Q_2$ is determined by the magnitude of the voltage $V_{CS}$, applied to the base of the current source transistor $Q_3$. The base of the emitter $Q_2$ is connected to a threshold voltage $V_T$ that establishes a switching level against which the pair of transistors $Q_1$ and $Q_2$ compare a TTL signal provided through an input node I. The TTL input signal is buffered through a buffering circuit consisting of $D_1$, $D_2$, and $R_1$. The buffered TTL signal is connected to the base of $Q_1$ and causes the current generated by the transistor $Q_3$ to be switched to either $Q_1$ or $Q_2$, depending upon the relationship of the level of the buffered TTL signal to the threshold voltage $V_T$. As is conventional, if the buffered TTL signal level is higher than $V_T$, $Q_1$ is turned on to fully conduct the emitter current. When the level of the buffered TTL signal falls below $V_T$, the transistor $Q_2$ is turned on to conduct all of the emitter current. The transistors $Q_4$ and $Q_5$ are emitter followers working with resistors $R_4$ and $R_5$, respectively, to provide low impedance drive for the complementary outputs O and $\overline{O}$ of the converter.

The improvement to the circuit of FIG. 1 represented by the Yang patent consists of the provision of a band gap voltage generator 12 to provide a threshold voltage $V_T$ that is stabilized with respect to temperature in order to maintain a reliable threshold against which the transistor pair $Q_1$ and $Q_2$ switch in response to the buffered TTL signal. Yang provides a temperature dependency in $V_T$ that works against and cancels a temperature dependency in the input buffer diode $D_1$. Thus, there is implicit in this improvement the admission that the input buffer can negatively affect the operation of the FIG. 1 converter.

In fact, the buffer section of the FIG. 1 converter imposes several other shortcomings on the operation of the converter. The pull-up resistor $R_1$ usually has a value in the range of 10K–15K ohms in order to maintain a low current level through the node I when the TTL signal is in a low state. However, the presence of $R_1$ imposes a long time constant during the low-to-high transition, thereby slowing the current switchover between the transistors $Q_2$ and $Q_1$ and lengthening the rise time of the positive-sense ECL signal at node O. When the TTL signal takes a high-to-low transition, the switch in conduction from transistor $Q_1$ to $Q_2$ is faster, since the current path extends through $D_1$, $D_2$, and the base-to-emitter junction of $Q_2$. The result is nonsymmetry and distortion between the positive and negative excursions of the ECL signal.

The presence of the buffer between the TTL circuit feeding the input node I and the emitter-coupled transistor pair $Q_1$ and $Q_2$ also imposes a delay in the process of converting from TTL to ECL signal formats. This naturally reduces the speed of any process depending upon the conversion.

Further, the two critical reference voltages in the FIG. 1 converter, that is $V_{CS}$ and $V_T$, are generated from different sources, with $V_{CS}$ being produced by a reference voltage generator 14. Since different sources are used to generate the voltages, it is difficult to make the voltages react in exactly the same way to a dynamic environment, which contributes further distortion to the converted waveform.

SUMMARY OF THE INVENTION

The limitation of the prior art converter can be overcome by the critical observation that a TTL signal can be applied directly to the base of one of the emitter-coupled transistors without either affecting the operation of the transistor or breaching the current level limitations of the TTL circuit. Application of the TTL signal directly to the base of one of the emitter-coupled transistors permits elimination of the diode $D_1$ and the pull-up resistor $R_1$, resulting in the removal of nonsymmetry in the output waveform of the converter. Further, removal of $R_1$ removes the need for the diode $D_2$. Therefore, component count is reduced. Finally, $R_2$ can be eliminated from the collection of transistor Q1 to further reduce the component count. This surrenders the first chance to provide a complementary set of signals O and Ō. However, design techniques are known to develop the complement of O where needed to implement specific functions.

A further observation resulting in invention of the below-summarized converter is that a stabilized threshold voltage developed from the reference voltage supplied to the constant current source transistor will result in better tracking of the reference and threshold voltages in response to environmental factors, particularly temperature.

In summary then, an apparatus has been invented for converting signals received from a saturated gate logic family such as TTL to signals compatible with a current-mode logic family, such as ECL. The converter comprises a constant current transistor responsive to a reference voltage with a predetermined temperature characteristic that generates a current constant over a predetermined temperature range. A first transistor of a converter transistor pair has an emitter connected to the constant current source transistor, a collector, and a base. The second transistor of the converter transistor pair has a collector, a base for receiving a threshold voltage, and an emitter connected to the emitter of the first transistor and to the constant current source transistor. An input node is connected to the base of the first transistor for receiving saturated gate logic signals which cause the first transistor or the second transistor of the converter pair to conduct the constant current based upon a predetermined relationship between the saturated gate logic signals and the threshold voltage. A current mirror circuit is also responsive to the reference voltage provided to the constant current source transistor for generating a threshold voltage that is substantially invariable over the predetermined temperature range and for providing the generated threshold voltage to the base of the second transistor of the converter pair.

The principal objective of the present invention is to reduce the distortion imposed on the output signal waveform obtained by conversion of the signals of one logic family to the signals of another logic family by a transistorized converter.

The second objective of the invention is to speed up the process of logic family signal conversion by applying the logic family signal to be converted directly to the converter without having to pass through an intermediary buffer circuit.

Determining the switching threshold of the converter transistor pair by means of a threshold voltage derived from a reference voltage that establishes the current switched by the pair insures that the responses of the threshold and reference voltages to environmental changes will be identical.

Other objectives and attendant advantages of the invention will be manifest upon a reading of the following description in view of the below-described illustrations.

DETAILED DESCRIPTION OF THE PREFERRED EMBODIMENT

Figure 2:
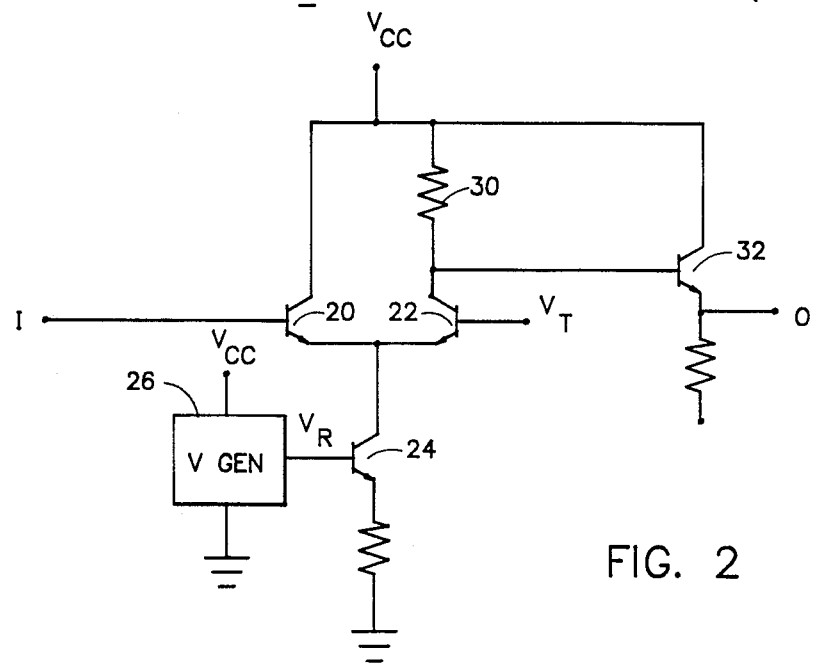
FIG. 2 is a combined block and schematic diagram that illustrates the signal converter of the invention.
Figure 3:
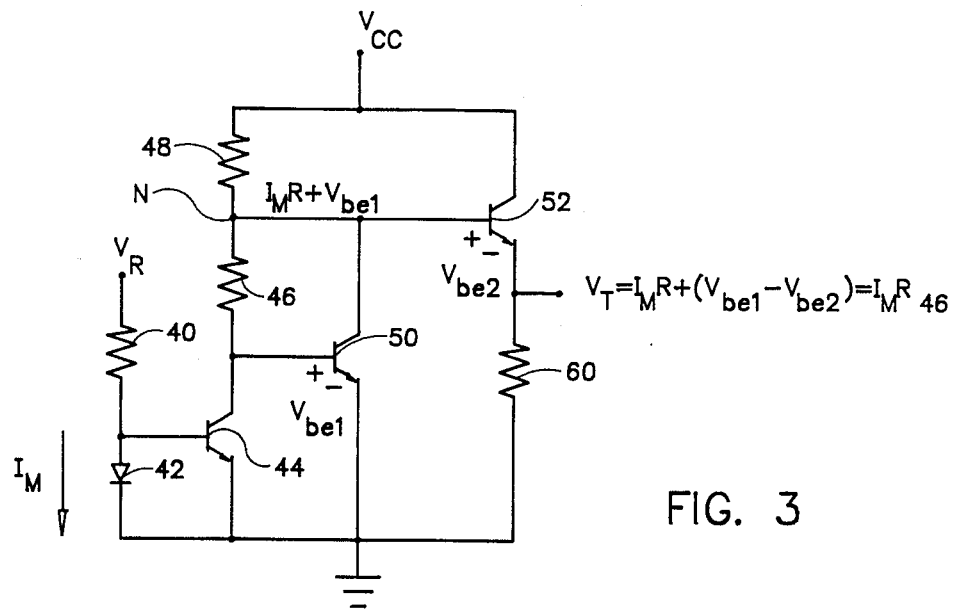
FIG. 3 is an illustration of a current mirror circuit used to develop a threshold voltage for the FIG. 2 converter from a reference voltage used by the converter for generation of a constant current.
Figure 4:
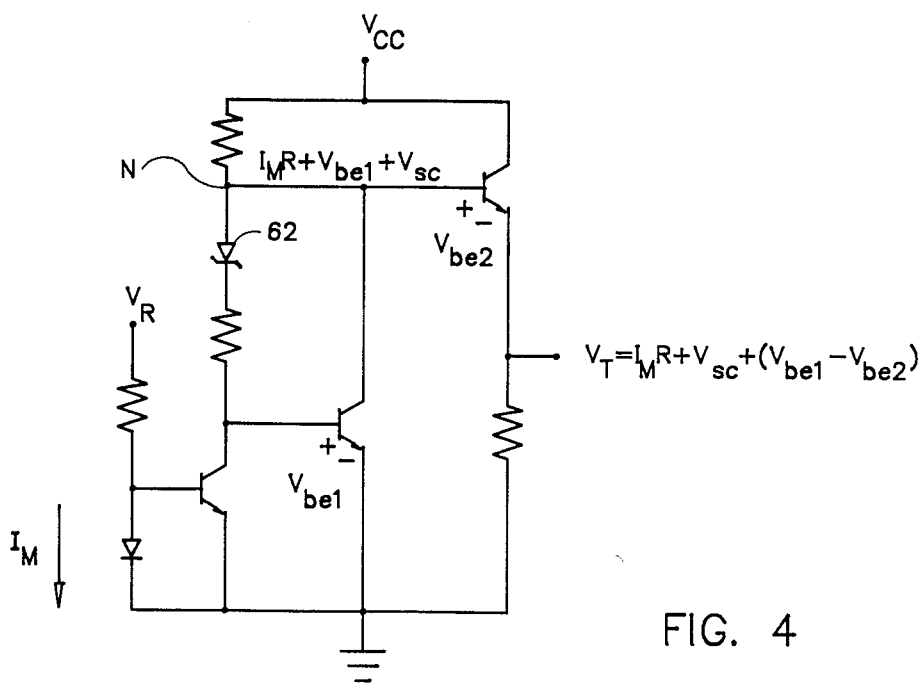
FIG. 4 illustrates the use of a diode in the current mirror circuit of FIG. 3 as another implementation of the $V_T$ generator circuit.

For an understanding of the logic family signal converter of the invention, refer now to FIGS. 2–4. In FIG. 2, a TTL-to-ECL signal converter consists of a pair of emitter-coupled transistors 20 and 22, a constant current transistor 24, and a voltage generator ($V_{GEN}$) 26. Development of an output ECL signal is provided by the circuit in the collector of the transistor 22 consisting of the resistor 30 and the transistor 32.

The pair of converter transistors 20 and 22 have their emitters coupled together and to the collector of the constant current transistor 24. The collectors of the transistor pair are connected to a collector voltage source $V_{CC}$, with the collector of the transistor 22 connected through the resistor 30. The resistor 30 develops a bias voltage that operates the transistor 32 and enables it to provide at its emitter a converted ECL signal at a node O.

In operation, a constant current is generated by the transistor 24 through the provision to its base of a reference voltage $V_R$. As for other products fabricated and sold by the assignee of this patent application, the voltage generator 26 has been designed to provide a negative voltage characteristic in the reference voltage $V_R$ that results in an increase in the level of the reference voltage by a predetermined amount over a predetermined temperature range. In the case of a particular class of those products, the predetermined temperature range is the Milspec temperature range extending from $-55°$ C. to $125°$ C. The negative characteristic in the reference voltage $V_R$ is provided to counter the temperature characteristic exhibited by the base-emitter junction of the transistor 24 over the predetermined temperature range. In operation, the voltage $V_R$ changes by an amount sufficient to counteract the response of the base-emitter diode so that a constant current is drawn through the collector of the transistor 24 over the predetermined temperature range.

The design of voltage generators that produce voltages having specified temperature characteristics is well-known. An example of a band gap voltage generator was given in the Yang patent referenced above. Reference is also made to a voltage generator design based on the well-known Widlar current source described at pages 202–203 in the work by Gray and Mayer entitled ANALYSIS AND DESIGN OF ANALOG INTEGRATED CIRCUITS, Wiley and Sons, 1977. The Gray and Mayer reference teaches design of a voltage generator that produces a voltage having a determinable temperature dependency.

The objective of stabilizing the current provided by the transistor 24 is to contribute to nonvariance of the output of the converter at the node O over the predetermined temperature range.

In operation, a TTL signal is input to the node I and conducted directly to the base of the transistor 20. Given the interconnection illustrated in FIG. 2 between the transistors 20 and 22, when an input TTL signal rises from a low to a high level, the transistor 20 will be turned on when the input TTL signal level exceeds the voltage level on the base of the transistor 22. At this point the base-emitter junction of the transistor 20 is forward biased, while the corresponding junction on the transistor 22 is less forward biased. Therefore, transistor 20 is fully on and transistor 22 is off. When the transistor 22 is turned off, the voltage on its collector rises toward $V_{CC}$. This produces a logic "1" on node O. Transistor 32 and resistor 33 act as an emitter follower to lower the output impedance.

When the TTL voltage level at the base of the transistor 20 drops below the level of the threshold voltage $V_T$ at the base of the transistor 22, the transistor 20 shuts off, the transistor 22 turns on and conducts the constant current through the resistor 30. Conduction of the switched current through the resistor 30 lowers the voltage on the base of the transistor 32. This produces a logic "0" on node O.

Figure 1:
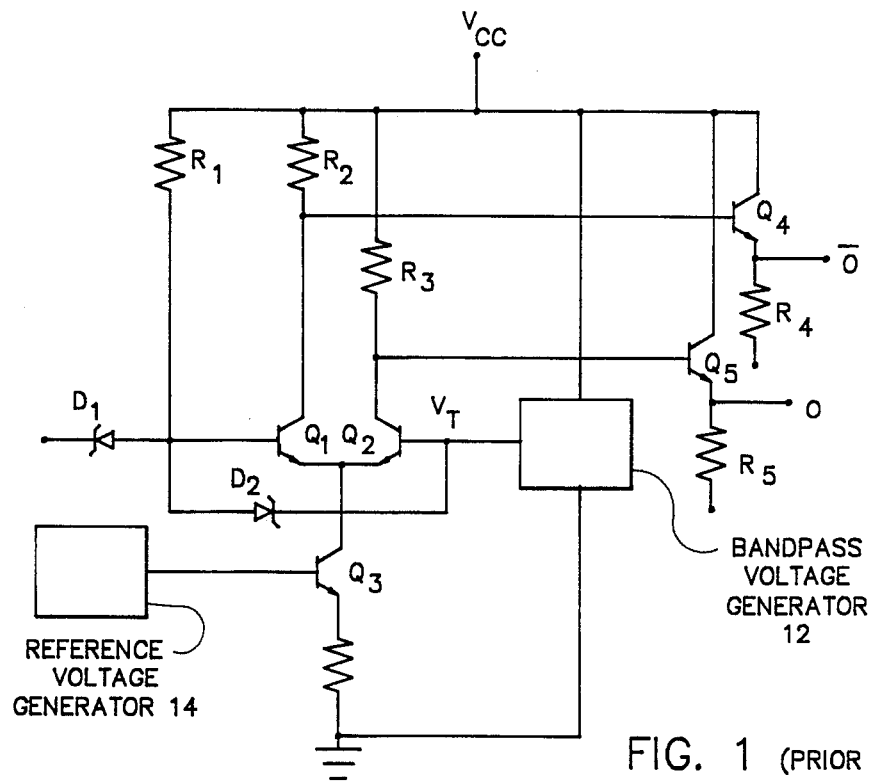
FIG. 1 illustrates a prior art logic family signal converter that includes an input buffer and separate generators for threshold and reference voltages used by the converter.

In contrast to the prior art circuit of FIG. 1, the converter of FIG. 2 responds more symmetrically to the TTL signals applied at the input node I because the signal path does not change with the input signal. To illustrate, in FIG. 1, when the TTL signal changes from low to high, the signal at the base of $Q_1$ changes according to a rate determined by the RC time constant in the path extending from $V_{CC}$ through $R_1$ and $D_2$ and into the base of $Q_2$. The base voltage of the transistor $Q_1$ changes at a rate determined by the RC time constant in the just-described path that is set by the value of $R_1$. The rate of change of $Q_1$'s base voltage, determined by the value of $R_1$, determines the rate of change of current switching between $Q_1$ and $Q_2$ and this establishes the rise time of the converted ECL signal. However, when the TTL signal at the node I changes from high to low, the buffer diode $D_1$ is switched on in the bias path for the base of the transistor $Q_1$, which now extends from the base of the transistor $Q_1$ through the diode $D_1$. This is essentially a low impedance path that permits the transistor $Q_1$ to turn off quickly. This quick turnoff is reflected in a negative-going slope of the converted ECL signal that is faster than the $R_1$-determined positive slope.

In contrast, in the circuit of FIG. 2, the transistor 20 is turned on and off only through the path extending between the input node I and the base of the transistor 20. As far as the converter circuit of FIG. 2 is concerned, the time constant of this path is the same when the transistor 20 turns off as when it turns on. This ensures symmetrical switching of the converter transistors 20 and 22, which results in symmetry of the output waveform at the node O. Not only does the converter in FIG. 2 ensure symmetrical switching, it also eliminates the delay caused by $R_1$, $D_1$, and $D_2$. Resultantly, the TTL signal is delivered to the converter of FIG. 2 without delay, whereas the converter of FIG. 1 must await passage of the TTL signal through the input buffer of the converter. The effect produced is a speedup in the conversion operation of the FIG. 2 converter when compared to the operation of the prior art converter of FIG. 1.

Temperature stabilization of the threshold voltage $V_T$ that is provided to the base of the transistor 22 is accomplished by operation of the circuit of FIG. 3. It contains a current mirror circuit consisting of a resistor 40, a diode 42, and a transistor 44, and a current-to-voltage converter consisting of resistors 46, 48, and 60 and transistors 50 and 52.

In operation, the reference voltage $V_R$ is provided to the current mirror circuit through the resistor 40, where it positively biases the diode 42. In the preferred embodiment the diode 42 is fabricated by connecting together the base and collector of a transistor formed during a conventional IC deposition process that also forms the transistors 24 and 44. The process is controlled so that the base-to-emitter characteristics of the transistors 42 and 44 are substantially equivalent. Thus, over the predetermined temperature range, the regressive temperature characteristic of the diode 42 is cancelled by the negative temperature characteristic in the voltage $V_R$ so that the mirror circuit current $I_M$ drawn by the diode 42 is constant over the temperature range. As is conventional, a current equal to the mirror current $I_M$ drawn by the diode 42 will be drawn by the transistor 44. Since the current drawn by the transistor 44 is constant over the temperature range, the voltage drop over the resistor 46, ($I_M R$ in FIG. 3) is constant over the specified temperature range. Further, provision of the transistor 50 with its base and collector separated by the resistor 46 and its emitter connected to ground will provide an increment of voltage at the node N between the resistors 46 and 48. The increment is equivalent to the voltage drop across the base-to-emitter junction of the transistor 50 which is illustrated in FIG. 3 as $V_{be1}$. When the current mirror is operating, the total voltage at the node N is the sum of the voltage drop across the resistor 46 and $V_{be1}$ as shown in FIG. 3. This is sufficient to bias the transistor 52 on while the current mirror is operating. Operation of the transistor 52 results in conduction of emitter current through the resistor 60 and the generation of a voltage $V_T$ between the resistor 60 and ground. The voltage $V_T$ is the sum of the voltage at the base of the transistor 52 and its base-to-emitter voltage, which is shown in FIG. 3 as $V_{be2}$. Thus, the expression of the threshold voltage $V_T$ is given in equation (1).

$$V_T = I_M R + (V_{be1} - V_{be2}) \tag{1}$$

Inspection of equation (1) shows that the base-to-emitter voltage drops of the transistors 50 and 52 cancel and that the threshold voltage $V_T$ is dependent only on the voltage drop across the resistor 46. Since this voltage depends only upon $I_M$, it is invariant over the temperature range and produces a threshold voltage $V_T$ that is stable over the specified temperature range.

Generation of both the reference voltage $V_R$ and the threshold voltage $V_T$ from the single voltage generator 26 reduces the componentry and space required for the functions when the combination of FIGS. 2 and 3 is compared with the prior art. The result is a lowered component count, more efficient use of space, and better control of the thermal budget of an integrated circuit using the converter of FIG. 2 in combination with the current mirror circuit of FIG. 3.

An alternative embodiment of the current mirror circuit of FIG. 3 is illustrated in FIG. 4 where a Schottky diode 62 is added between the node N and the resistor 46. Provision of the Schottky diode 62 results in circuit operation that is easier to stabilize if ground reference is too noisy, as it reduces the gain of the amplifier.

I claim:

1. An unbuffered translating circuit for converting saturated logic voltage signals to ECL signals, comprising:

a voltage generator which produces a current-source reference voltage $V_R$ having a predetermined negative temperature dependence characteristic over a predetermined temperature range (55° C. to 125° C.);

a constant current transistor connected to said voltage source for generating a switching current in response to $V_R$, said switching current being substantially invariant over said predetermined temperature range;

a pair of switching transistors, one of said switching transistors connected to receive an unbuffered saturated-logic voltage signal and the other of said switching transistors connected to receive a threshold voltage $V_T$, said switching transistors both being connected at their emitters to said constant current transistor such that said switching current is switched to a respective one of said switching transistors in response to a change in the magnitude of said unbuffered saturated logic signal with respect to the magnitude of $V_T$; and transistor current mirror means connected to said voltage generator for generating $V_T$ in response to $V_R$ such that $V_T$ includes a transistor base-to-emitter voltage component and is substantially invariant over said predetermined temperature range.

2. The unbuffered translating circuit of claim 1, wherein said constant current transistor has a positive base voltage-temperature characteristic and wherein said transistor current mirror means includes a diode means connected to said voltage generator and having a positive voltage-temperature characteristic which is substantially equal to said positive base voltage-temperature characteristic for generating a mirror current $I_M$ that is constant over said predetermined temperature range; and transistor conversion means connected across said diode means for converting $I_M$ to $V_T$.

3. An apparatus for TTL-to-ECL signal buffering and translating, comprising:

voltage generator means for providing a current-source reference voltage $V_R$ which has a first predetermined temperature characteristic over a predetermined temperature range;

constant current means responsive to said current-source reference voltage $V_R$ for generating a current that is constant over said predetermined temperature range;

a first transistor having an emitter connected to said constant current means, a collector, and a baes;

a second transistor having a collector, an emitter connected to said constant current means, and a base for receiving a threshold voltage $V_T$;

an input node connected to said first transistor base for receiving unbuffered TTL logic signals which cause said first transistor or said second transistor to conduct said constant current based upon a predetermined relationship between said unbuffered TTL logic signals and said threshold voltage $V_T$; and current mirror means connected to said voltage generator means for generating said threshold voltage $V_T$ from said current-source reference voltage $V_R$ such that said threshold voltage $V_T$ is substantially invariable over said temperature range and for providing said threshold voltage $V_T$ to said second transistor base.

4. The apparatus of claim 1 wherein said constant current means includes a transistor having a base-emitter junction possessing a second predetermined temperature characteristic opposite to said first predetermined temperature characteristic, and said current mirror means includes:

diode means connected to said voltage generator means and having a temperature characteristic substantially equivalent to said second temperature characteristic for generating a mirror current $I_M$ in response to said current-source reference voltage $V_R$ such that $I_M$ is substantially constant over said predetermined temperature range; and transistor conversion means connected across said diode means for converting said mirror current $I_M$ to said threshold voltage $V_T$.

5. The apparatus of claim 4 wherein said conversion means includes a Schottky diode for adding a Schottky diode temperature characteristic to said threshold voltage $V_T$.

* * * * *

UNITED STATES PATENT AND TRADEMARK OFFICE
CERTIFICATE OF CORRECTION

PATENT NO.   :   4,736,125
DATED        :   April 5, 1988
INVENTOR(S)  :   Raymond C. Yuen It is certified that error appears in the above-identified patent and that said Letters Patent is hereby corrected as shown below:

Claim 4 dependency is incorrect. Please change "1" in Column 8, line 24, to --3--.

Signed and Sealed this

Twenty-second Day of May, 1990

Attest:

HARRY F. MANBECK, JR.

*Attesting Officer*       Commissioner of Patents and Trademarks